US008936902B2

(12) United States Patent
Kitson et al.

(10) Patent No.: US 8,936,902 B2
(45) **Date of Patent: *Jan. 20, 2015**

(54) POSITIVE-WORKING IMAGEABLE ELEMENTS AND METHOD OF USE

(75) Inventors: Anthony P. Kitson, Greeley, CO (US); Kevin B. Ray, Hudson, NH (US); Shashikant Saraiya, Fort Collins, CO (US); Frederic E. Mikell, Greeley, CO (US); Jayanti Patel, Fort Collins, CO (US)

(73) Assignee: Eastman Kodak Company, Rochester, NY (US)

( * ) Notice: Subject to any disclaimer, the term of this patent is extended or adjusted under 35 U.S.C. 154(b) by 1668 days.

This patent is subject to a terminal disclaimer.

(21) Appl. No.: 12/274,488

(22) Filed: Nov. 20, 2008

(65) Prior Publication Data

US 2010/0124721 A1 May 20, 2010

(51) Int. Cl.
*G03F 7/00* (2006.01)
*G03F 7/26* (2006.01)
*B41C 1/10* (2006.01)

(52) U.S. Cl.
CPC ........... *B41C 1/1008* (2013.01); *B41C 2210/02* (2013.01); *B41C 2210/06* (2013.01); *B41C 2210/22* (2013.01); *B41C 2210/24* (2013.01); *B41C 2210/262* (2013.01); *B41C 2210/266* (2013.01)
USPC ........................................ 430/302; 430/270.1

(58) Field of Classification Search
CPC ........... G03F 7/00; G03F 7/004; G03F 7/322; G03F 7/32; G03F 7/035; G03F 7/26; B41C 1/10; B41C 1/1008; B41C 2210/00; B41C 2210/12; B41C 2210/266; B41C 2210/06; B41M 1/00; B41M 1/02; B41M 1/06
USPC ........................................... 430/270.1, 273.1
See application file for complete search history.

(56) References Cited

U.S. PATENT DOCUMENTS

| | | | | |
|---|---|---|---|---|
| 6,517,987 | B2 | 2/2003 | Fujita et al. | |
| 6,555,291 | B1 | 4/2003 | Hauck | |
| 7,060,416 | B2 * | 6/2006 | Ray et al. | 430/285.1 |
| 7,247,418 | B2 | 7/2007 | Saraiya et al. | |
| 7,300,726 | B1 | 11/2007 | Patel et al. | |
| 7,678,531 | B2 * | 3/2010 | Mulligan et al. | 430/270.1 |
| 7,858,292 | B2 * | 12/2010 | Baumann et al. | 430/302 |
| 2004/0110090 | A1 * | 6/2004 | Patel et al. | 430/302 |
| 2005/0064325 | A1 | 3/2005 | Nakamura et al. | |
| 2005/0136356 | A1 * | 6/2005 | Van Damme et al. | 430/270.1 |
| 2005/0214675 | A1 * | 9/2005 | Watanabe et al. | 430/270.1 |
| 2006/0046198 | A1 * | 3/2006 | Hunter et al. | 430/276.1 |
| 2006/0210917 | A1 * | 9/2006 | Ray et al. | 430/270.1 |
| 2008/0182206 | A1 | 7/2008 | Mulligan et al. | |
| 2008/0307990 | A1 * | 12/2008 | Andriessen et al. | 101/467 |

FOREIGN PATENT DOCUMENTS

| | | |
|---|---|---|
| EP | 0 901 902 | 3/1999 |
| EP | 1 510 337 A | 3/2005 |
| EP | 1 577 111 A | 9/2005 |

OTHER PUBLICATIONS

U.S. Appl. No. 11/971,941, filed Jan. 10, 2008, titled *Positive-Working Imageable Elements With Chemical Resistance*, by Tao et al.
U.S. Appl. No. 12/017,408, filed Jan. 22, 2008, titled *Method of Making Lithographic Printing Plates*, by K.B.Ray et al.
U.S. Appl. No. 11/774,626, filed Jul. 9, 2007, titled *Imageable Elements With Low PH Developer Solubility*, by Savariar-Hauck et al.

* cited by examiner

*Primary Examiner* — Chanceity Robinson
(74) *Attorney, Agent, or Firm* — J. Lanny Tucker

(57) ABSTRACT

An infrared radiation-sensitive positive-working imageable element has a substrate and single imageable layer that includes a first polymeric binder having urethane or urea moieties in its backbone. The first polymeric binder is also insoluble in water and soluble in a weakly alkaline solution. This imageable element can be imaged and processed using weakly alkaline processing solutions that are free of silicates and metasilicates, which processing solutions may also be used to "gum" the imaged and developed printing surface.

9 Claims, No Drawings

POSITIVE-WORKING IMAGEABLE ELEMENTS AND METHOD OF USE

FIELD OF THE INVENTION

This invention relates to positive-working imageable elements having a single imageable layer that can be imaged and developed using weakly alkaline processing solutions. It also relates to methods of imaging and developing these imageable elements particularly to provide lithographic printing plates.

BACKGROUND OF THE INVENTION

In conventional or "wet" lithographic printing, ink receptive regions, known as image areas, are generated on a hydrophilic surface. When the surface is moistened with water and ink is applied, the hydrophilic regions retain the water and repel the ink, and the ink receptive regions accept the ink and repel the water. The ink is transferred to the surface of a material upon which the image is to be reproduced. For example, the ink can be first transferred to an intermediate blanket that in turn is used to transfer the ink to the surface of the material upon which the image is to be reproduced.

Imageable elements useful to prepare lithographic printing plates typically comprise an imageable layer applied over the hydrophilic surface of a substrate. The imageable layer includes one or more radiation-sensitive components that can be dispersed in a suitable binder. Alternatively, the radiation-sensitive component can also be the binder material. Following imaging, either the imaged regions or the non-imaged regions of the imageable layer are removed by a suitable developer, revealing the underlying hydrophilic surface of the substrate. If the imaged regions are removed, the element is considered as positive-working. Conversely, if the non-imaged regions are removed, the element is considered as negative-working. In each instance, the regions of the imageable layer (that is, the image areas) that remain are ink-receptive, and the regions of the hydrophilic surface revealed by the developing process accept water and aqueous solutions, typically a fountain solution, and repel ink.

Direct digital imaging has become increasingly important in the printing industry. Imageable elements for the preparation of lithographic printing plates have been developed for use with infrared lasers. Thermally imageable elements positive-working thermally imageable elements are used for making lithographic printing plates using various developers in U.S. Pat. No. 6,200,727 (Urano et al.), U.S. Pat. No. 6,358,669 (Savariar-Hauck et al), and U.S. Pat. No. 6,534,238 (Savariar-Hauck et al.). In some instances, such multi-layer imageable elements are developed using low pH developers when the upper layer includes novolak resins and dissolution suppressing agents.

Copending and commonly assigned, U.S. Ser. No. 11/686,981 (filed Mar. 16, 2006 by Savariar-Hauck et al.) describes and claims a method of processing using low pH developers in which the processed elements contain certain phenolic resins in the upper layer. Other imaged elements developable in low pH developers are described in U.S. Pat. No. 6,555,291 (Savariar-Hauck).

Single-layer, positive-working imageable elements are described for example, in U.S. Pat. No. 6,280,899 (Hoare et al.), U.S. Pat. No. 6,391,524 (Yates et al.), U.S. Pat. No. 6,485,890 (Hoare et al.), U.S. Pat. No. 6,558,869 (Hearson et al.), U.S. Pat. No. 6,706,466 (Parsons et al.), U.S. Pat. No. 7,041,427 (Loccufier et al.), and U.S. Patent Application Publication 2006/0130689 (Müller et al.). When imaged, such elements are typically developed using high pH silicate-containing developers.

Other positive-working single- and multi-layer imageable elements containing various unique polymeric binders are described in U.S. Pat. No. 7,247,418 (Saraiya et al.) and U.S. Pat. No. 7,300,726 (Patel et al.).

U.S. Patent Application Publication 2008/0182206 describes positive-working imageable elements having a mixture of polymeric binders in the same imageable layer.

SUMMARY OF THE INVENTION

This invention provides an infrared radiation-sensitive positive-working imageable element comprising a substrate having thereon a single imageable layer, the imageable layer comprising an infrared radiation absorbing compound and a first polymeric binder comprising urethane or urea moieties in its backbone, wherein the first polymeric binder is insoluble in water and soluble in an alkaline solution.

This invention also provides a method of providing an image comprising:

A) using a laser, imagewise exposing the imageable element of this invention to provide an exposed element having exposed and non-exposed regions, and B) contacting the exposed element with an alkaline processing solution having a pH of 12 or less to remove predominantly only the exposed regions.

This method can be used to provide lithographic printing plates having a hydrophilic substrate.

Applicants discovered that there is a need to provide single-layer positive-working imageable elements that can be imaged and processed without using high pH, silicate-containing developers. The present invention was unpredictably found to fulfill that need.

The present invention provides single-layer imageable elements that upon imaging, can be processed using a weakly alkaline processing solution. In some embodiments, the processing solution can also contain a gumming component so that a separate gumming or rinsing step is eliminated. These advantages are achieved by using specific polymeric binders in the single imageable layer.

DETAILED DESCRIPTION OF THE INVENTION

Definitions

Unless the context indicates otherwise, when used herein, the terms "imageable element", "positive-working imageable element", and "printing plate precursor" are meant to be references to embodiments of the present invention.

In addition, unless the context indicates otherwise, the various components described herein such as "first polymeric binder", "second polymeric binder", "dissolution inhibitor", "coating solvent", "radiation absorbing compound", and similar terms also refer to mixtures of such components. Thus, the use of the article "a" or "an" is not necessarily meant to refer to only a single component.

By "single-layer" imageable element, we mean an imageable element of this invention that has only a single layer needed for providing an image. The first polymeric binder (defined below) would be located in this single imageable layer that is usually the outermost layer. However, such elements may comprise additional non-imaging layers on either side of the substrate.

By the term "predominantly remove said exposed regions" during development, we mean that the exposed regions of the outermost layer and the corresponding regions of any underlying layers are selectively and preferentially removed by the alkaline processing solution.

Unless otherwise indicated, percentages refer to percents by dry weight (solids) of with a composition, formulation, or applied layer.

For clarification of definitions for any terms relating to polymers, reference should be made to "Glossary of Basic Terms in Polymer Science" as published by the International Union of Pure and Applied Chemistry ("IUPAC"), Pure Appl. Chem. 68, 2287-2311 (1996). However, any definitions explicitly set forth herein should be regarded as controlling.

Unless otherwise indicated, the term "polymer" refers to high and low molecular weight polymers including oligomers and includes homopolymers and copolymers.

The term "copolymer" refers to polymers that are derived from two or more different monomers. That is, they comprise recurring units having at least two different chemical structures.

The term "backbone" refers to the chain of atoms in a polymer to which a plurality of pendant groups can be attached. An example of such a backbone is an "all carbon" backbone obtained from the polymerization of one or more ethylenically unsaturated polymerizable monomers. However, backbones for the first polymeric binder include heteroatoms wherein the polymer is formed by a condensation reaction or some other means.

Uses

The imageable elements described herein can be used in a number of ways such as lithographic printing plate precursors as described in more detail below. However, this is not meant to be their only use. For example, the imageable elements can also be used as thermal patterning systems, chemically amplified resists, and microelectronic and microoptical devices, and to form masking elements and printed circuit boards.

First Polymeric Binders

The first polymeric binders useful in this invention have either urethane or urea moieties, or both types of moieties, in their backbones.

For example, some useful first polymeric binders are polyurethanes that have —NH—CO—O— units or linkage in the polymer chain. They are generally obtained through the reaction of a diisocyanate with a diol.

For example, aromatic or aliphatic diisocyanates can be used for this purpose. Aromatic diisocyanates include but are not limited to, 2,4-toluene diisocyanate, 2,6-toluene diisocyanate, p-xylene diisocyanate, m-xylene diisocyanate, tetramethylxylene diisocyanate, 4,4-diphenylmethane diisocyanate, 1,5-naphthalene diisocyanate, and 3,3'-dimethylbiphenyl-4,4'-diisocyanate. Aliphatic diisocyanates include but are not limited to, hexamethylene diisocyanate, trimethylhexamethylene diisocyanate, isophorone diisocyanate, 4,4-methylene-bis(cyclohexyl isocyanate), methylcyclohexane-2,4- and 2,6-diisocyanate, and 1,4-bis(isocyanatomethyl)cyclohexane.

Examples of useful diols include but are not limited to, ethylene glycol, diethylene glycol, polyethylene glycol, propylene glycol, polypropylene glycol, neopentyl glycol, 1,4-butanediol, and 1,6-hexanediol.

The polyurethane may also comprise acidic groups, that is, groups with a $pK_a$ of 7 or less, such as sulfonic acid, phosphoric acid, phosphonic acid, or carboxylic acid groups. Useful diols that comprise one or more acidic groups include but are not limited to, dialkanol alkyl sulfonic acids, dialkanol alkyl phosphoric acids, and dialkanol alkyl phosphoric acids. Useful carboxyl functional diols include but are not limited to, dialkanol alkanoic acids, such as 2,2-bis(hydroxymethyl) propionic acid (2,2-dimethylol propanoic acid), 2,2-bis(2-hydroxyethyl) propionic acid, 2,2-bis(3-hydroxypropyl) propionic acid, bis(hydroxymethyl)acetic acid, bis(4-hydroxyphenyl)acetic acid, 2,2-bis(hydroxymethyl) butyric acid, 2,2-bis(hydroxymethyl)pentanoic acid, and tartaric acid, dihydroxybenzoic acids such as 3,5-dihydroxybenzoic acid, and dihydroxy dicarboxylic acids derived by reaction of dianhydrides with diols, such as the reaction product of a dianhydride such as pyromellitic dianhydride, 3,3',4,4'-benzophenone tetracarboxylic dianhydride, 3,3',4,4'-diphenyl tetracarboxylic dianhydride, or 2,3,6,7-naphthalene tetracarboxylic dianhydride with a diol such as ethylene glycol, diethylene glycol, triethylene glycol, polyethylene glycol, 1,2- or 1,3-propanediol, polypropylene glycol, 1,2- or 1,4-butanediol, neopentyl glycol, or 1,6-hexanediol.

In some embodiments, the polyurethane also comprises a sulfone unit in the backbone that is derived by using a sulfone-containing diol, for example, bis[4-(2-hydroxyethoxy)phenyl]sulfone, 1,3-bis(3-hydroxypropylsulfonyl)propane and 1,4-bis(3-hydroxypropylsulfonyl)butane.

Useful first polymeric binders can also be polyureas that contain urea linkages, —NH—CO—NH—, formed from compounds bearing up to two amine groups that are reactive toward urethane groups, for example, ethylenediamine, N-alkylethylenediamine, propylenediamine, 2,2-dimethyl-1,3-propanediamine, N-alkylpropylenediamine, butylenediamine, N-alkylbutylenediamine, hexamethylenediamine, N-alkylhexamethylenediamine, toluenediamine, diaminodiphenylmethane, diaminodicyclohexylmethane, phenylenediamine, cyclohexyldiamine, bis(aminophenyl)sulfone, isophoronediamine, 2-butyl-2-ethyl-1,5-pentamethylenediamine, 2,2,4- or 2,4,4-trimethyl-1,6-hexamethylenediamine, 2-aminopropylcyclohexylamine, 3(4)-aminomethyl-1-methylcyclohexylamine, 1,4-diamino-4-methylpentane, amine-terminated polyoxyalkylene polyols (known as Jeffamines), animated polytetramethylene glycols, N-aminoalkylpiperidines, ammonia, bis(aminoethyl)amine, bis(aminopropyl)amine, bis(aminobutyl)amine, bis(aminopentyl)amine and bis(aminohexyl)amine.

The first polymeric binder is present in the imageable layer in an amount of at least 50 weight % and up to 99.5 weight %, or typically from about 70 to about 97 weight %, based on layer solids.

The first polymeric binders useful in this invention can be prepared using known starting materials and reaction conditions. Representative synthetic methods for making these polymers are provided below before the Examples. A skilled artisan would be able to use this teaching to prepare other first polymeric binders within the scope of this invention.

The imageable elements include the first polymeric binders as the predominant binders in the single and generally outermost imageable layer.

In general, the imageable elements are formed by suitable application of an imageable layer formulation containing one or more first polymeric binders to a suitable substrate to form an imageable layer. This substrate is usually treated or coated in various ways as described below prior to application of the formulation. The substrate can be treated to provide an "interlayer" for improved adhesion or hydrophilicity, and the single imageable layer is applied over the interlayer.

The substrate generally has a hydrophilic surface, or at least a surface that is more hydrophilic than the applied imageable layer formulation on the imaging side. The substrate comprises a support that can be composed of any material that is conventionally used to prepare imageable elements such as lithographic printing plates. It is usually in the form of a sheet, film, or foil, and is strong, stable, and flexible and resistant to dimensional change under conditions of use so that color records will register a full-color image. Typically, the support can be any self-supporting material including polymeric films (such as polyester, polyethylene, polycarbonate, cellulose ester polymer, and polystyrene films), glass, ceramics, metal sheets or foils, or stiff papers (including resin-coated and metallized papers), or a lamination of any of these materials (such as a lamination of an aluminum foil onto a polyester film). Metal supports include sheets or foils of aluminum, copper, zinc, titanium, and alloys thereof.

Polymeric film supports may be modified on one or both surfaces with a "subbing" layer to enhance hydrophilicity, or paper supports may be similarly coated to enhance planarity. Examples of subbing layer materials include but are not limited to, alkoxysilanes, amino-propyltriethoxysilanes, glycidioxypropyl-triethoxysilanes, and epoxy functional polymers, as well as conventional hydrophilic subbing materials used in silver halide photographic films (such as gelatin and other naturally occurring and synthetic hydrophilic colloids and vinyl polymers including vinylidene chloride copolymers).

A useful substrate is composed of an aluminum-containing support that may be coated or treated using techniques known in the art, including physical graining, electrochemical graining, chemical graining, and anodizing. For example, the aluminum sheet can be anodized using phosphoric acid or sulfuric acid using conventional procedures.

An optional interlayer may be formed by treatment of the aluminum support with, for example, a silicate, dextrine, calcium zirconium fluoride, hexafluorosilicic acid, phosphate solution containing an inorganic fluoride, poly(vinyl phosphonic acid) (PVPA), vinyl phosphonic acid-acrylic acid copolymer, poly(acrylic acid), or (meth)acrylic acid copolymer, or mixtures thereof. For example, the grained and/or anodized aluminum support can be treated with poly(phosphonic acid) using known procedures to improve surface hydrophilicity to provide a lithographic hydrophilic substrate.

The thickness of the substrate can be varied but should be sufficient to sustain the wear from printing and thin enough to wrap around a printing form. Such embodiments typically include a treated aluminum foil having a thickness of from about 100 to about 600 μm.

The backside (non-imaging side) of the substrate may be coated with antistatic agents and/or slipping layers or a matte layer to improve handling and "feel" of the imageable element.

The substrate can also be a cylindrical surface having the imageable layer formulation applied thereon, and thus be an integral part of the printing press or a sleeve that is incorporated onto a press cylinder. The use of such imageable cylinders is described for example in U.S. Pat. No. 5,713,287 (Gelbart).

The imageable element also includes one or more infrared radiation absorbing compounds ("IR absorbing compounds") such as infrared radiation absorbing dyes ("IR dyes") that absorb radiation from about 600 to about 1200 nm and typically from about 700 to about 1200 nm.

Examples of suitable IR dyes include but are not limited to, azo dyes, squarylium dyes, triarylamine dyes, thioazolium dyes, indolium dyes, oxonol dyes, oxazolium dyes, cyanine dyes, merocyanine dyes, phthalocyanine dyes, indocyanine dyes, indotricarbocyanine dyes, hemicyanine dyes, streptocyanine dyes, oxatricarbocyanine dyes, thiocyanine dyes, thiatricarbocyanine dyes, merocyanine dyes, cryptocyanine dyes, naphthalocyanine dyes, polyaniline dyes, polypyrrole dyes, polythiophene dyes, chalcogenopyryloarylidene and bi(chalcogenopyrylo)-polymethine dyes, oxyindolizine dyes, pyrylium dyes, pyrazoline azo dyes, oxazine dyes, naphthoquinone dyes, anthraquinone dyes, quinoneimine dyes, methine dyes, arylmethine dyes, polymethine dyes, squaraine dyes, oxazole dyes, croconine dyes, porphyrin dyes, and any substituted or ionic form of the preceding dye classes. Suitable dyes are described for example, in U.S. Pat. No. 4,973,572 (DeBoer), U.S. Pat. No. 5,208,135 (Patel et al.), U.S. Pat. No. 5,244,771 (Jandrue Sr. et al.), and U.S. Pat. No. 5,401,618 (Chapman et al.), and EP 0 823 327A1 (Nagasaka et al.).

Cyanine dyes having an anionic chromophore are also useful. For example, the cyanine dye may have a chromophore having two heterocyclic groups. In another embodiment, the cyanine dye may have at least two sulfonic acid groups, more particularly two sulfonic acid groups and two indolenine groups. Useful IR-sensitive cyanine dyes of this type are described for example in U.S Patent Application Publication 2005-0130059 (Tao). A general description of one class of suitable cyanine dyes is shown by the formula in paragraph 0026 of WO 2004/101280 (Munnelly et al.).

In addition to low molecular weight IR-absorbing dyes, IR dye moieties bonded to polymers can be used as well. Moreover, IR dye cations can be used as well, that is, the cation is the IR absorbing portion of the dye salt that ionically interacts with a polymer comprising carboxy, sulfo, phospho, or phosphono groups in the side chains.

Near infrared absorbing cyanine dyes are also useful and are described for example in U.S. Pat. No. 6,309,792 (Hauck et al.), U.S. Pat. No. 6,264,920 (Achilefu et al.), U.S. Pat. No. 6,153,356 (Urano et al.), U.S. Pat. No. 5,496,903 (Watanabe et al.). Suitable dyes may be formed using conventional methods and starting materials or obtained from various commercial sources including American Dye Source (Baie D'Urfe, Quebec, Canada) and FEW Chemicals (Germany). Other useful dyes for near infrared diode laser beams are described, for example, in U.S. Pat. No. 4,973,572 (noted above).

Useful IR absorbing compounds also include various pigments including carbon blacks such as carbon blacks that are surface-functionalized with solubilizing groups are well known in the art. Carbon blacks that are grafted to hydrophilic, nonionic polymers, such as FX-GE-003 (manufactured by Nippon Shokubai), or which are surface-functionalized with anionic groups, such as CAB-O-JET® 200 or CAB-O-JET® 300 (manufactured by the Cabot Corporation) are also useful. Other useful pigments include, but are not limited to, Heliogen Green, Nigrosine Base, iron (III) oxides, manganese oxide, Prussian Blue, and Paris Blue. The size of the pigment particles should not be more than the thickness of the imageable layer.

The infrared radiation absorbing compound is generally present in the imageable element in an amount sufficient to render the imageable layer insoluble to an aqueous developer after exposure to appropriate radiation. This amount is generally at least 0.1% and up to 30 weight % and typically from about 3 to about 20 weight % (based on total dry layer weight). The particular amount needed for this purpose would be readily apparent to one skilled in the art, depending upon the specific compound used and the properties of the alkaline developer to be used. In most embodiments, the infrared radiation absorbing compound is present in the single imageable layer. Alternatively or additionally, infrared radiation absorbing compounds may be located in a separate layer that is in thermal contact with the single imageable layer. Thus, during imaging, the action of the infrared radiation absorbing compound can be transferred to the imageable layer without the compound originally being incorporated into it.

In addition, solubility-suppressing components may be incorporated into the imageable layer. Such components act as dissolution inhibitors that function as solubility-suppressing components for the primary polymeric binders. Dissolution inhibitors typically have polar functional groups that are believed to act as acceptor sites for hydrogen bonding with various groups in the polymeric binders. The acceptor sites comprise atoms with high electron density, and can be selected from electronegative first row elements such as carbon, nitrogen, and oxygen. Dissolution inhibitors that are soluble in the alkaline developer are useful. Useful polar groups for dissolution inhibitors include but are not limited to, ether groups, amine groups, azo groups, nitro groups, ferrocenium groups, sulfoxide groups, sulfone groups, diazo groups, diazonium groups, keto groups, sulfonic acid ester groups, phosphate ester groups, triarylmethane groups, onium groups (such as sulfonium, iodonium, and phosphonium groups), groups in which a nitrogen atom is incorporated into a heterocyclic ring, and groups that contain a positively charged atom (such as quaternized ammonium group). Compounds that contain a positively-charged nitrogen atom useful as dissolution inhibitors include, for example, tetralkyl ammonium compounds and quaternized heterocyclic compounds such as quinolinium compounds, benzothiazolium compounds, pyridinium compounds, and imidazolium compounds. Further details and representative compounds useful as dissolution inhibitors are described for example in U.S. Pat. No. 6,294,311 (noted above). Useful dissolution inhibitors include triarylmethane dyes such as ethyl violet, crystal violet, malachite green, brilliant green, Victoria blue B, Victoria blue R, and Victoria pure blue BO, BASONYL® Violet 610 and D11 (PCAS, Longjumeau, France). These compounds can also act as contrast dyes that distinguish the non-imaged areas from the imaged areas in the developed imageable element.

One group of polymeric materials that comprise polar groups and function as dissolution inhibitors are derivatized phenolic polymeric materials in which a portion of the phenolic hydroxyl groups have been converted to sulfonic acid esters, preferably phenyl sulfonates or p-toluene sulfonates. Derivatization can be carried out by reaction of the polymeric material with, for example, a sulfonyl chloride such as p-toluene sulfonyl chloride in the presence of a base such as a tertiary amine. A useful material is a novolak resin in which from about 1 to about 3 mol % of the hydroxyl groups has been converted to phenyl sulfonate or p-toluene sulfonate (tosyl) groups.

Another group of polymeric materials that comprise polar groups and function as dissolution inhibitors are derivatized phenolic resins that contain the diazonaphthoquinone moiety. Polymeric diazonaphthoquinone compounds include derivatized resins formed by the reaction of a reactive derivative that contains diazonaphthoquinone moiety and a polymeric material that contains a suitable reactive group, such as a hydroxyl or amino group. Derivatization of phenolic resins with compounds that contain the diazonaphthoquinone moiety is known in the art and is described, for example, in U.S. Pat. Nos. 5,705,308 and 5,705,322 (both West, et al.). An example of a resin derivatized with a compound that comprises a diazonaphthoquinone moiety is P-3000 (available from PCAS, France) that is a naphthoquinone diazide of a pyrogallol/acetone resin.

When a dissolution inhibitor is present in the imageable layer, its amount can vary widely, but generally it is present in an amount of at least 0.5 weight % and up to 30 weight %, and typically from about 1 to about 15 weight % (based on the total dry layer weight).

The imageable layer also generally includes one or more additional (or second) polymeric binders other than the first polymeric binders defined above. Such second polymeric binders are also generally soluble in water and an alkaline solution having a pH of 12 or less. They can comprise polar groups, or they can comprise a mixture of binder resins, some with polar groups and others without polar groups. Such second polymeric binders generally include phenolic resins such as novolak and resole resins (described below), and such resins can also include one or more pendant diazo, carboxylate ester, phosphate ester, sulfonate ester, sulfinate ester, or ether groups. The hydroxy groups of the phenolic resins can be converted to -T-Z groups in which T represents a polar group and Z represents a non-diazide functional group as described for example in U.S. Pat. No. 6,218,083 (McCullough et al.) and WO 99/001795 (McCullough et al.). The hydroxy groups can also be derivatized with diazo groups containing o-naphthoquinone diazide moieties as described for example in U.S. Pat. No. 5,705,308 (West et al.) and U.S. Pat. No. 5,705,322 (West et al.). Other useful second polymeric binders include acrylate copolymers, cellulose esters, and poly(vinyl acetals) as described for example in U.S. Pat. No. 6,391,524 (Yates et al.) and DE 10 239 505 (Timpe et al.).

Useful second polymeric binders also include phenolic resins that have a multiplicity of phenolic hydroxyl groups either on the polymer backbone or on pendent groups. Novolak resins, resol resins, acrylic resins that contain pendent phenol groups, and polyvinyl phenol resins are useful phenolic resins.

Novolak resins are commercially available and are well known to those in the art. Novolak resins are typically prepared by the condensation reaction of a phenol, such as phenol, m-cresol, o-cresol, p-cresol, etc, with an aldehyde, such as formaldehyde, paraformaldehyde, acetaldehyde, etc. or ketone, such as acetone, in the presence of an acid catalyst. The weight average molecular weight is typically about 1,000 to 15,000. Typical novolak resins include, for example, phenol-formaldehyde resins, cresol-formaldehyde resins, phenol-cresol-formaldehyde resins, p-t-butylphenol-formaldehyde resins, and pyrogallol-acetone resins. Useful novolak resins are prepared by reacting m-cresol, mixtures of m-cresol and p-cresol, or phenol with formaldehyde using conditions well known to those skilled in the art.

Other useful second polymeric binders include acrylic polymers such as those having an acid number of at least 40 and being represented by the following Structure (I):

$$-(A)_w-(B)_x-(C)_y-(D)_z- \quad (I)$$

wherein A represents recurring units derived from one or more N-alkoxymethyl(alkyl)acrylamides or alkoxymethyl(alkyl)acrylates. For example, the A recurring units can be derived from one or more of N-methoxymethyl methacrylamide, N-iso-propoxymethyl methacrylamide, N-n-butoxymethyl methacrylamide, N-ethoxymethyl acrylamide, N-methoxymethyl acrylamide, iso-propoxymethyl methacrylate, N-cyclohexoxymethyl methacrylamide, and phenoxymethyl methacrylate.

The B represents recurring units are derived from one or more ethylenically unsaturated polymerizable monomers having a pendant cyano group. For example, they are derived from one or more (meth)acrylonitriles, cyanostyrenes, and cyanoacrylates.

The C recurring units are derived from one or more ethylenically unsaturated polymerizable monomers having one or more carboxy, sulfonic acid, or phosphate groups including but not limited to, (meth)acrylic acids, carboxystyrenes, N-carboxyphenyl(meth)acrylamides, and (meth)acryloylalkyl phosphates.

The D represents recurring units derived from one or more ethylenically unsaturated polymerizable monomers other than those represented by A, B, and C, and can be chosen from one or more ethylenically unsaturated polymerizable monomers represented by the following Structures (D1) through (D5):

(D1)

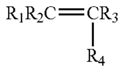

(D2)

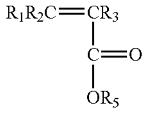

(D3)

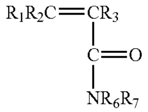

(D4)

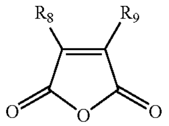

(D5)

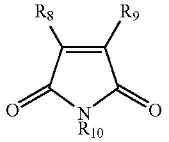

wherein $R_1$ and $R_2$ are independently hydrogen or substituted or unsubstituted, linear or branched alkyl, substituted or unsubstituted alkenyl, substituted or unsubstituted phenyl, halo, alkoxy, acyl, or acyloxy groups, or $R_1$ and $R_2$ together can form a substituted or unsubstituted cyclic ring with the carbon atom to which they are attached. The optional substituents on these groups would be readily apparent to one skilled in the art. Typically, $R_1$ and $R_2$ are independently hydrogen, or a substituted or unsubstituted alkyl group having 1 to 4 carbon atoms (such as methyl or ethyl groups).

$R_3$ and $R_4$ are independently hydrogen or substituted or unsubstituted alkyl, substituted or unsubstituted phenyl, or halo groups. Typically, $R_3$ and $R_4$ are independently substituted or unsubstituted alkyl groups having 1 to 6 carbon atoms, substituted or unsubstituted phenyl groups, and chloro groups.

$R_5$ is a substituted or unsubstituted alkyl, alkenyl, cycloalkyl, or phenyl group. Typically, $R_5$ is a methyl, ethyl, or benzyl group.

$R_6$ through $R_9$ are independently hydrogen or substituted or unsubstituted alkyl, alkenyl, alkoxy, or phenyl groups, halo, acyl, or acyloxy groups. Typically, $R_6$ through $R_9$ are independently hydrogen, methyl, or ethyl groups.

$R_{10}$ is hydrogen or a substituted or unsubstituted alkyl or phenyl group, or a hydroxy group. Typically, $R_{10}$ is a substituted or unsubstituted phenyl group.

Thus, classes of monomers from which the D recurring units can be derived include styrenes, (meth)acrylates, (meth) acrylamides, N-phenylmaleimides, iso-propyl(meth)acrylamides, and maleic anhydride. Other possibilities would be readily apparent to a worker skilled in the art.

In Structure (I), w is from about 3 to about 80 weight % (typically from about 10 to about 5 weight %), x is from about 10 to about 85 weight % (typically from about 20 to about 70 weight %), y is from about 2 to about 80 weight % (typically from about 5 to about 50 weight %), and z is from about 10 to about 85 weight % (typically from about 20 to about 70 weight %).

In some embodiments, the optional second polymeric binder comprises recurring units derived from:

one or more of N-methoxymethyl methacrylamide, N-iso-propoxymethyl methacrylamide, N-n-butoxymethyl methacrylamide, N-ethoxymethyl acrylamide, N-methoxymethyl acrylamide, iso-propoxymethyl methacrylate, N-cyclohexoxymethyl methacrylamide, and phenoxymethyl methacrylate, one or more of acrylonitrile, methacrylonitrile, (meth) acrylic acid, p-cyanostyrene, and ethyl-2-cyanoacrylate, one or more of acrylic acid, methacrylic acid, p-carboxystyrene, p-carboxyphenyl methacrylamide, and (meth)acryloylethyl phosphate, and one or more of styrene, N-phenylmaleimide, methacrylamide, and methyl methacrylate.

These second polymeric binders may be present in the imageable layer in an amount of from about 2 to about 50 weight % and typically from about 5 to about 30 weight % (based on imageable layer dry weight).

The imageable layer can further include a variety of additives including dispersing agents, humectants, biocides, plasticizers, surfactants for coatability or other properties, viscosity builders, dyes or colorants to allow visualization of the written image, pH adjusters, drying agents, defoamers, preservatives, antioxidants, development aids, rheology modifiers, or combinations thereof, or any other addenda commonly used in the lithographic art, in conventional amounts.

The single-layer imageable element can be prepared by applying the layer formulation(s) over the surface of the substrate (and any other hydrophilic layers provided thereon) using conventional coating or lamination methods. Thus, the formulations can be applied by dispersing or dissolving the desired ingredients in a suitable coating solvent, and the resulting formulations are sequentially or simultaneously applied to the substrate using suitable equipment and procedures, such as spin coating, knife coating, gravure coating, die coating, slot coating, bar coating, wire rod coating, roller coating, or extrusion hopper coating. The formulations can also be applied by spraying onto a suitable support (such as an on-press printing cylinder or printing sleeve). The dry coating weight for the imageable layer can be from about 0.5 to about 2.5 $g/m^2$ and typically from about 1 to about 2 $g/m^2$.

The selection of solvents used to coat the imageable layer formulation depends upon the nature of the polymeric materials and other components in the formulations. Generally, the imageable layer formulation is coated out of acetone, methyl ethyl ketone, or another ketone, tetrahydrofuran, 1-methoxypropan-2-ol, 1-methoxy-2-propyl acetate, and mixtures thereof using conditions and techniques well known in the art. Useful solvent mixtures are described below for the various Coating Solutions used in the Invention Examples.

Alternatively, the imageable layer may be applied by conventional extrusion coating methods from melt mixtures of the respective layer compositions. Typically, such melt mixtures contain no volatile organic solvents.

After drying the layers, the element can be further "conditioned" with a heat treatment at from about 40 to about 90° C. for at least 4 hours (for example, at least 20 hours) under conditions that inhibit the removal of moisture from the dried layers. For example, the heat treatment is carried out at from about 50 to about 70° C. for at least 24 hours. During the heat treatment, the imageable element is wrapped or encased in a water-impermeable sheet material to represent an effective barrier to moisture removal from the precursor, or the heat treatment of the imageable element is carried out in an environment in which relative humidity is controlled to at least 25%. In addition, the water-impermeable sheet material can be sealed around the edges of the imageable element, with the water-impermeable sheet material being a polymeric film or metal foil that is sealed around the edges of the imageable element.

In some embodiments, this heat treatment can be carried out with a stack comprising at least 100 of the same imageable elements, or when the imageable element is in the form of a coil or web.

Imaging and Development

The imageable elements can have any useful form including, but not limited to, printing plate precursors, printing cylinders, printing sleeves (solid or hollow cores) and printing tapes (including flexible printing webs). For example, the imageable elements can be lithographic printing plate precursors useful for providing lithographic printing plates having hydrophilic substrate surfaces.

Printing plate precursors can be of any size or shape (for example, square or rectangular) having the requisite one or more imageable layers disposed on a suitable substrate. Printing cylinders and sleeves are known as rotary printing members having a substrate and at least one imageable layer in cylindrical form. Hollow or solid metal cores can be used as substrates for printing sleeves.

During use, the imageable elements are exposed to a suitable source of radiation such as infrared radiation, depending upon the infrared radiation absorbing compound present in the element, for example at a wavelength of from about 600 to about 1500 nm and typically from about 700 to about 1200 nm. The lasers used to expose the imageable elements are usually one or more diode lasers, because of the reliability and low maintenance of diode laser systems, but other lasers such as gas or solid-state lasers may also be used. The combination of power, intensity and exposure time for laser imaging would be readily apparent to one skilled in the art. Presently, high performance lasers or laser diodes used in commercially available image setters emit infrared radiation at a wavelength of from about 800 to about 850 nm or from about 1040 to about 1120 nm.

The imaging apparatus can function solely as a plate setter (or image setter) or it can be incorporated directly into a lithographic printing press. In the latter case, printing may commence immediately after imaging, thereby reducing press set-up time considerably. The imaging apparatus can be configured as a flatbed recorder or as a drum recorder, with the imageable element mounted to the interior or exterior cylindrical surface of the drum. Examples of useful imaging apparatus are available as models of Kodak® Trendsetter image setters available from Eastman Kodak Company (Burnaby, British Columbia, Canada) that contain laser diodes that emit near infrared radiation at a wavelength of about 830 nm. Other suitable imaging sources include the Crescent 42T Platesetter that operates at a wavelength of 1064 nm and the Screen PlateRite 4300 series or 8600 series plate setter (available from Screen, Chicago, Ill.). Additional useful sources of radiation include direct imaging presses that can be used to image an element while it is attached to the printing plate cylinder. An example of a suitable direct imaging printing press includes the Heidelberg SM74-DI press (available from Heidelberg, Dayton, Ohio).

Imaging speeds may be in the range of from about 50 to about 1500 $mJ/cm^2$, and typically from about 75 to about 400 $mJ/cm^2$.

While laser imaging is useful in the practice of this invention, the imageable element can be imaged by any other means that provides thermal energy in an imagewise fashion. For example, imaging can be accomplished using a thermoresistive head (thermal printing head) in what is known as "thermal printing", as described for example in U.S. Pat. No. 5,488,025 (Martin et al.) and as used in thermal fax machines and sublimation printers. Thermal print heads are commercially available (for example, as a Fujitsu Thermal Head FTP-040 MCS001 and TDK Thermal Head F415 HH7-1089).

Direct digital imaging is generally used for imaging. The image signals are stored as a bitmap data file on a computer. Raster image processor (RIP) or other suitable means may be used to generate such files. The bitmaps are constructed to define the hue of the color as well as screen frequencies and angles.

Imaging of the imageable element produces an imaged element that comprises a latent image of imaged (exposed) and non-imaged (non-exposed) regions. Developing the imaged element with a suitable alkaline processing solution removes predominantly only the exposed regions of the imageable layer and reveals the hydrophilic surface of the substrate. Thus, the imageable elements are "positive-working" (for example, positive-working lithographic printing plate precursors). The revealed regions of the hydrophilic surface repel ink while the non-exposed regions of the outer layer accept ink. Because of the nature of the first polymeric binder(s) used in the imageable layer, removal of the exposed regions readily occurs during development but the removed portions of the imageable layer are readily soluble in the processing solution thereby reducing sludge or residue in that solution.

The imaged elements are generally developed using a weakly alkaline processing solution that has a pH of 12 or less, or typically 11 or less or 10.5 or less, or even 10.2 or less (measured at 25° C.). The processing solution does not contain any effective amounts of silicates or metasilicates or alkali metal hydroxides as is common in the higher pH developers used in the art.

Some useful weakly alkaline processing solutions are single-phase solutions of water and one or more organic solvents that are miscible with water or at least soluble enough that phase separation does not occur. Useful organic solvents can contain the reaction products of phenol with ethylene oxide and propylene oxide [such as ethylene glycol phenyl ether (phenoxyethanol)], benzyl alcohol, esters of ethylene glycol and of propylene glycol with acids having 6 or less carbon atoms, or ethers of ethylene glycol, diethylene glycol, and of propylene glycol with alkyl groups having 6 or less carbon atoms, such as 2-ethylethanol and 2-butoxyethanol. The organic solvent(s) is generally present in an amount of from about 0.5 to about 15%, or typically from about 3 to about 20%, based on total developer weight.

Representative processing solutions useful in this invention include but are not limited to, ND-1 Developer, SW-DI Developer, 955 Developer, 956 Developer, 989 Developer, and 980 Developer (all available from Eastman Kodak Company), HDN-1 Developer (available from Fuji), and EN 232 Developer (available from Agfa). Another useful processing solution is described below as SW-D3 and used in the Examples. These processing solutions can be used to advantage in the methods of this invention in combination with unique first polymeric binder in an imageable layer to provide desired advantages.

Following development, the imaged element can be rinsed with water and dried in a suitable fashion. The dried element can also be treated with a conventional gumming solution (preferably gum arabic).

The weakly alkaline processing solution can also be designed both to "develop" the imaged precursors and to provide a protective layer or coating over the entire imaged and developed surface. In this second aspect, the processing solution can behave somewhat like a gum that is capable of protecting the lithographic image on the printing plate against contamination or damage (for example, from oxidation, fingerprints, dust, or scratches). One advantage of using such processing solutions is that no separate gumming or rinsing step is necessary before using the resulting lithographic printing plate for printing. However, before printing, any excess processing solution may be removed from the lithographic printing plate by wiping or use of a squeegee or a pair of nip rollers in an apparatus, followed by optional drying using any suitable drying means.

Such processing solutions may be provided in diluted or concentrated form. Various components can be present in the processing solution to provide the development and gumming functions, except for those components specifically excluded above.

For example, some of the processing solutions have one or more anionic surfactants. Useful anionic surfactants include those with carboxylic acid, sulfonic acid, or phosphonic acid groups (or salts thereof). Anionic surfactants having sulfonic acid (or salts thereof) groups are particularly useful. For example, such anionic surfactants can include aliphates, abietates, hydroxyalkanesulfonates, alkanesulfonates, dialkylsulfosuccinates, alkyldiphenyloxide disulfonates, straight-chain alkylbenzenesulfonates, branched alkylbenzenesulfonates, alkylnaphthalenesulfonates, alkylphenoxypolyoxy-ethylenepropylsulfonates, salts of polyoxyethylene alkylsulfonophenyl ethers, sodium N-methyl-N-oleyltaurates, monoamide disodium N-alkylsulfosuccinates, petroleum sulfonates, sulfated castor oil, sulfated tallow oil, salts of sulfuric esters of aliphatic alkylester, salts of alkylsulfuric esters, sulfuric esters of polyoxy-ethylene alkylethers, salts of sulfuric esters of aliphatic monoglucerides, salts of sulfuric esters of polyoxyethylenealkylphenylethers, salts of sulfuric esters of polyoxyethylenestyrylphenylethers, salts of alkylphosphoric esters, salts of phosphoric esters of polyoxyethylenealkylethers, salts of phosphoric esters of polyoxyethylenealkylphenylethers, partially saponified compounds of styrene-maleic anhydride copolymers, partially saponified compounds of olefin-maleic anhydride copolymers, and naphthalenesulfonateformalin condensates. Alkyldiphenyloxide disulfonates (such as sodium dodecyl phenoxy benzene disulfonates), alkylated naphthalene sulfonic acids, sulfonated alkyl diphenyl oxides, and methylene dinaphthalene sulfonic acids) are particularly useful as the primary anionic surfactant. Such surfactants can be obtained from various suppliers as described in McCutcheon's Emulsifiers & Detergents, 2007 Edition.

Particular examples of such anionic surfactants include but are not limited to, sodium dodecylphenoxyoxybenzene disulfonate, the sodium salt of alkylated naphthalenesulfonate, disodium methylene-dinaphthalene disulfonate, sodium dodecylbenzenesulfonate, sulfonated alkyl-diphenyloxide, ammonium or potassium perfluoroalkylsulfonate and sodium dioctylsulfosuccinate.

The one or more anionic surfactants can be generally present in an amount of at least 1 weight %, and typically from about 5 weight % or from about 8 weight % and up to about 45 weight %, or up to about 30 weight % (% solids).

Two or more anionic surfactants ("first", "second", etc.) can also be used in combination. In such mixtures, a first anionic surfactant, such as an alkyldiphenyloxide disulfonate, can be present generally in an amount of at least 1 weight % and typically from about 5 to about 20 weight %. A second surfactant can be present (same or different from the first anionic surfactant) in a total amount of at least 1 weight %, and typically from about 3 to about 20 weight %. Second or additional anionic surfactants can be selected from the substituted aromatic alkali alkyl sulfonates and aliphatic alkali sulfates. One particular combination of anionic surfactants includes one or more alkyldiphenyloxide disulfonates and one or more aromatic alkali alkyl sulfonates (such as an alkali alkyl naphthalene sulfonate).

The processing solutions useful in this invention may optionally include nonionic surfactants as described in [0029] or hydrophilic polymers described in [0024] of EP 1,751,625 (noted above), incorporated herein by reference. Particularly useful nonionic surfactants include Mazol® PG031-K (a triglycerol monooleate, Tween® 80 (a sorbitan derivative), Pluronic® L62LF (a block copolymer of propylene oxide and ethylene oxide), and Zonyl® FSN (a fluorocarbon), and a nonionic surfactant for successfully coating the processing solution onto the printing plate surface, such as a nonionic polyglycol. These nonionic surfactants can be present in an amount of up to 10 weight %, but at usually less than 2 weight % (% solids).

Other optional components of the processing solution include inorganic salts (such as those described in [0032] of U.S. Patent Application Publication 2005/0266349, noted above), wetting agents (such as a glycol), metal chelating agents, antiseptic agents, organic amines, anti-foaming agents, ink receptivity agents (such as those described in [0038] of US '349), and viscosity increasing agents as noted above. Useful amounts of such components are known in the art from their use in traditional alkaline developers or gum solutions. Other useful addenda include but not limited to, phosphonic acids or polycarboxylic acids, or salts thereof that are different than the anionic surfactants described above. Such acids can be present in an amount of at least 0.001 weight % and typically from about 0.001 to about 10 weight % (% solids), and can include but are not limited to, polyaminopolycarboxylic acids, aminopolycarboxylic acids, or salts thereof, [such as salts of ethylenediaminetetraacetic acid (EDTA, sodium salt)], organic phosphonic acids and salts thereof, and phosphonoalkanetricarboxylic acids and salts thereof.

Generally, after imaging, the alkaline processing solution is applied to the imaged element by rubbing, spraying, jetting, dipping, immersing, coating, or wiping the outer layer with the processing solution or contacting the imaged element with a roller, impregnated pad, or applicator containing the processing solution. For example, the imaged element can be brushed with the processing solution, or the processing solution can be poured onto or applied by spraying the imaged surface with sufficient force to remove the exposed regions using a spray nozzle system as described for example in [0124] of EP 1,788,431A2 (noted above). Still again, the imaged element can be immersed in the processing solution and rubbed by hand or with an apparatus.

The processing solution can also be applied in a processing unit (or station) as a component of a suitable apparatus that has at least one roller for rubbing or brushing the precursor while the processing solution is applied. By using such a processing unit, the exposed regions of the imaged layer may be removed from the substrate more completely and quickly. Residual processing solution may be removed (for example, using a squeegee or nip rollers) or left on the resulting printing plate (and dried) without any rinsing step. It is desirable that processing be carried out using processor systems and apparatus that allow the processing solution to reside on the imaged precursor for sufficient time of interaction between the processing solution and the precursor imaged coatings before mechanical means (such as brush or plush rollers) are used.

Excess processing solution can be collected in a tank and used several times, and replenished if necessary from a reservoir of "fresh" processing solution. A replenisher solution can be of the same concentration as that used during processing, it can be provided in concentrated form and diluted with water at an appropriate time, or it can comprise an entirely different composition.

The imaged and developed element can also be baked in a postbake operation that can be carried out to increase run length of the resulting imaged element. Baking can be carried out, for example at from about 160° C. to about 240° C. for from about 2 to about 10 minutes. In some embodiments, the imaged and developed element is baked at a temperature of from about 150 to about 250° C. for from about 1 to about 10 minutes.

A lithographic ink and fountain solution can be applied to the printing surface of the imaged element for printing. The non-exposed regions of the imageable layer take up ink and the hydrophilic surface of the substrate revealed by the imaging and development process takes up the fountain solution. The ink is then transferred to a suitable receiving material (such as cloth, paper, metal, glass, or plastic) to provide a desired impression of the image thereon. If desired, an intermediate "blanket" roller can be used to transfer the ink from the imaged member to the receiving material. The imaged members can be cleaned between impressions, if desired, using conventional cleaning means and chemicals.

The following Examples are provided to illustrate the present invention but are not meant to be limiting in any way.

EXAMPLES

The following materials were used in the following examples:

Polymer A:

A polyurethane prepared according to the following procedure: 67.26 g of bis(4-(2-hydroxyethoxy)phenyl)sulfone, 10.38 g of neopentyl glycol, 66.60 g of dimethylol propionic acid, 270.0 g of N,N-dimethylacetamide, and 0.36 g of dibutyltin didodecanoate were added to a one-liter 4-neck ground glass flask, equipped with a mantle heater, temperature controller, mechanical stirrer, condenser and nitrogen inlet outside of the solution. The mixture was heated to 100° C. Then a pre-mixture of 132.72 g of 4,4'-diphenylmethanediisocyanate, 23.04 g of toluene 2,4-diisocyanate, and 180 g of N,N-dimethylacetamide was added for one hour at 100° C. The reaction was continued another four hours. The Gardner viscosity was S-T. After the reaction, the resin solution was precipitated in 8 liters of de-ionized water and stirred with a mechanical stirrer for 30 minutes. It was then filtered and the slurry was re-dispersed in 4 liter of de-ionized water, stirred for 30 minutes and filtered. The resin powder was vacuum dried at 60° C. until constant weight. The yield was 100%.

Polymer B:

114.0 g of dimethylacetamide, 13.89 g of 2,2-dimethyl-1-3 propanediol [NPG (0.1334 mol)], 27.69 g of 2,2-bis(hydroxylmethyl) propionic acid (DMPA (0.2066 mol)], and 0.15 g of dibutyl tin dilaurate were charged into a four necked 500 ml flask fitted with a heating mantle, temperature controller, mechanical stirrer, condenser and nitrogen inlet. After 10 minutes stirring at room temperature, the reaction mixture was heated to 80° C. Premix of 181.35 g of dimethylacetamide and 84.85 g of 4-4'-methylene bis(phenyl isocyanate) [MDI (0.3333 mol)] was added in one hour at 80° C. Three hours later, the percent —NCO was 0.0. The completion of reaction was determined by the disappearance of isocyanate by IR (absorption band at 2275 $cm^1$) and by titration. The resulting clear solution had a kinematic viscosity of "D+" (G.H'33) at 30% non-volatile.

This resin solution was precipitated in powder form by addition of a mixture of water/ice (5.7 kg) with stirring, using a lab dispersator at 4000 rpm. The mixture was filtered off and dried at room temperature for one day and 110° F. (43° C.) oven over a period of two days. The powder had an acid number of 88.3 mg/KOH.

Polymer C:

113.1 g of dimethylacetamide, 16.92 g of bis[4-(2-hydroxy ethyoxy)-phenyl]sulfone [SDOL, (0.05 mol), 3.91 g of 2,2-dimethyl-1-3 propanediol [NPG (0.0375 mol)], 23.45 g of 2,2-bis(hydroxylmethyl) propionic acid (DMPA (0.1750 mol)], and 0.13 g of dibutyl tin dilaurate were charged into a four necked 500 ml flask fitted with a heating mantle, temperature controller, mechanical stirrer, condenser and nitrogen inlet. After 10 minutes stirring at room temperature, the reaction mixture was heated to 80° C. Premix of 211.0 g of dimethylacetamide and 63.63 g of 4-4'-methylene bis(phenyl isocyanate) [MDI (0.25 mol)] was added in one hour at 80° C. Three hours later, the percent —NCO was 0.0. The completion of reaction was determined by the disappearance of isocyanate by IR (absorption band at 2275 $cm^1$) and by titration. The resulting clear solution had a kinematic viscosity of "A" (G.H'33) at 25% non-volatile.

This resin solution was precipitated in powder form by addition of a mixture of water/ice (5.7 kg) with stirring, using a lab dispersator at 4000 rpm. The mixture was filtered off and dried at 110° F. (43° C.) oven over a period of two days. The powder had an acid number of 86.9 mg/KOH.

Polymer D:

35.0 g of dimethylacetamide, 5.083 g of bis[4-(2-hydroxy ethyoxy)phenyl]sulfone [SDOL, (0.01502 mol), 1.78 g of 1H-benz[e]indolium, 2-[2-[2-chloro-3-[[1,3-dihydro-3-(2-hydroxy ethyl)-1,1-dimethyl-2H-benz[e]indol-2-ylidene] ethylidene]-1-cyclohexen-1-yl]ethenyl]-3-(2-hydroxy-ethyl)-1,1-dimethyl-salt with trifluoromethanesulfonic acid (1:1) [0.00224 mol], 1.171 g of 2,2-dimethyl-1-3 propanediol [NPG (0.01124 mol)], 6.532 g of 2,2-bis(hydroxylmethyl) propionic acid (DMPA (0.04875 mol)], and 0.04 g of dibutyl tin dilaurate were charged into a four necked 500 ml flask fitted with a heating mantle, temperature controller, mechanical stirrer, condenser and nitrogen inlet. After 10 minutes stirring at room temperature, the reaction mixture was heated to 80° C. A premix of 66.0 g of dimethylacetamide and 19.09 g of 4-4'-methylene bis(phenyl isocyanate) [MDI (0.05 mol)] was added in one hour at 80° C. Four hours later, the percent —NCO was 0.0. The completion of reaction was determined by the disappearance of isocyanate by IR (absorption band at 2275 $cm^1$). The resulting solution contains 5.3% (weight) dye. TLC indicated the reaction was completed.

This resin solution was precipitated in powder form by addition of a mixture of water/ice (2 kg) with stirring, using a lab dispersator at 4000 rpm. The mixture was filtered off and dried at 110° F. (43° C.) oven over a period of two days. The powder had an acid number of 81.3 mg/KOH (Theoretical).

Polymer E: 124.0 g of dimethylacetamide, 12.69 g of bis [4-(2-hydroxy ethyoxy)-phenyl]sulfone [SDOL, (0.0375 mol), 3.91 g of 2,2-dimethyl-1-3 propanediol [NPG (0.0375 mol)], 21.77 g of 2,2-bis(hydroxylmethyl) propionic acid (DMPA (0.1625 mol)], and 0.05 g of dibutyl tin dilaurate were charged into a four necked 500 ml flask fitted with a heating mantle, temperature controller, mechanical stirrer, condenser and nitrogen inlet. After 10 minutes stirring at room temperature, the reaction mixture was heated to 60° C. A premix of 268.2 g of dimethylacetamide and 63.5 g of 4-4'-methylene bis(phenyl isocyanate) [MDI (0.0.25 mol)] was added in one hour at 60° C. The residual —NCO percent was analyzed by titration method until percent —NCO was reached to theoretical (0.52%). Immediately, the reaction mixture was cooled to 40° C. Then, a pre-mixture of 21.0 g of dimethylacetamide and 1.45 g of hexamethylene diamine (0.0125 mol) was added in fifteen minutes at 40° C. One hour later, the percent —NCO was 0.0. The completion of reaction was determined by the disappearance of isocyanate by IR (absorption band at 2275 $cm^1$) and by titration. The resulting clear solution had a kinematic viscosity of "B+" (G.H'33) at 20% non-volatiles.

This resin solution was precipitated in powder form by addition of a mixture of water/ice (5.7 kg) with stirring, using a lab dispersator at 4000 rpm. The mixture was filtered off and dried at 110° F. (43° C.) oven over a period of two days. The powder had an acid number of 87.5 mg/KOH.

IR dye A: KF654 was obtained from Honeywell, N.J., USA.

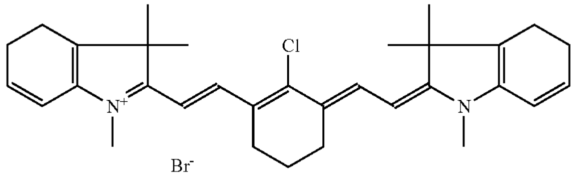 [SMILES: CN1C2=C(CCC=C2)C(C)(C)/C1=C\C=C1/CCCC(/C=C/C2=[N+](C)C3=C(CCC=C3)C2(C)C)=C1Cl ; [Br-]]

Byk® 307: A polyethoxylated dimethylpolysiloxane that was obtained from BYK Chemie of Wallingford, Conn.

4-Dimethylaminobenzoic acid: Supplied by Aldrich Chemical Company, Milwaukee, Wis.

Crystal violet: A violet dye C.I. 42555; CAS 548-62-9; $[(p\text{-}(CH_3)_2NC_6H_4)_3C^+Cl^-]$.

Substrate A: 0.3 mm gauge aluminum sheet, electrograined, anodized and subjected to treatment with polyvinylphosphonic acid.

SW-D1: A developer solution available from Kodak Graphic Communications Japan LTD.

SW-D3: A developer solution consisting of 100 parts SW-D1, and 11 parts Dowfax 2A1 that is available from Dow Chemical Company, Midland, Mich.

ND1: A developer solution available from Kodak Graphic Communications Japan LTD.

PGME represents 1-methoxypropan-2-ol (or Dowanol® PM).

DEK represents diethyl ketone.

MEK represents methyl ethyl ketone.

BLO represents γ-butyrolactone.

Coating Solution 1:

| | |
|---|---|
| Solvent: (PGME/DEK/MEK 65/20/15 wt. %) | 42.748 g |
| Polymer A | 6.167 g |
| IR dye A | 0.105 g |
| 4-Dimethylaminobenzoic acid | 0.56 g |
| Crystal violet | 0.14 g |
| Byk ® 307 (10% solution in DEK) | 0.280 g |

Coating Solution 2:

| | |
|---|---|
| Solvent: (PGME/DEK/MEK 65/20/15 wt. %) | 42.748 g |
| Polymer B | 6.167 g |
| IR dye A | 0.105 g |
| 4-Dimethylaminobenzoic acid | 0.56 g |
| Crystal violet | 0.14 g |
| Byk ® 307 (10% solution in DEK) | 0.280 g |

Coating Solution 3:

| | |
|---|---|
| Solvent: (PGME/DEK/MEK 65/20/15 wt. %) | 42.748 g |
| Polymer C | 6.167 g |
| IR dye A | 0.105 g |
| 4-Dimethylaminobenzoic acid | 0.560 g |
| Crystal violet | 0.140 g |
| Byk ® 307 (10% solution in DEK) | 0.280 g |

Coating Solution 4:

| | |
|---|---|
| Solvent: (PGME/MEK/BLO 70/25/5 wt. %) | 13.912 g |
| Polymer D | 0.941 g |
| 4-Dimethylaminobenzoic acid | 0.084 g |
| Crystal violet | 0.021 g |
| Byk ® 307 (10% solution in DEK) | 0.042 g |

Coating Solution 5:

| | |
|---|---|
| Solvent: (PGME/MEK/BLO/water 50/30/10/10 wt. %) | 23.187 g |
| Polymer E | 1.533 g |
| IR dye A | 0.0350 g |
| 4-Dimethylaminobenzoic acid | 0.140 g |
| Crystal violet | 0.035 g |
| Byk ® 307 (10% solution in DEK) | 0.070 g |

Coating solution 6:

| | |
|---|---|
| Solvent: (PGME/DEK/MEK 65/20/15 wt. %) | 13.912 g |
| Polymer A | 0.920 g |
| IR dye A | 0.021 g |
| 4-Dimethylaminobenzoic acid | 0.084 g |
| Crystal violet | 0.021 g |
| Byk ® 307 (10% solution in DEK) | 0.042 g |

Coating solution 7:

| | |
|---|---|
| Solvent: (PGME/DEK/MEK 65/20/15 wt. %) | 42.748 g |
| Polymer A | 6.342 g |
| IR dye A | 0.140 g |
| 4-Dimethylaminobenzoic acid | 0.35 g |
| Crystal violet | 0.140 g |
| Byk ® 307 (10% solution in DEK) | 0.280 g |

Printing Plate Precursor 1:

A one-layer, lithographic printing plate precursor was produced by applying Coating Solution 1 to Substrate A with a 0.006 inch (0.015 cm) wire-wound bar to provide a dry coating weight of approximately 1.50 g/m$^2$. The Coating 1 was dried for 35 seconds at 120° C. The imageable element was then conditioned in an oven at 62° C. for 24 hours at ambient humidity.

Printing Plate Precursor 2:

The same coating procedure was used as for Printing Plate Precursor 1 except that Coating Solution 2 was used.

Printing Plate Precursor 3:

The same coating procedure was used as for Printing Plate Precursor 1 except that Coating Solution 3 was used.

Printing Plate Precursor 4:

A one-layer, lithographic printing plate precursor was by applying Coating Solution 4 to Substrate A with a 0.012 inch (0.03 cm) wire-wound bar to provide a dry coating weight of approximately 1.50 g/m$^2$. This Coating 4 was dried for 35 seconds at 120° C. The imageable element was then conditioned in an oven at 62° C. for 24 hours at ambient humidity.

Printing Plate Precursor 5:

The same coating procedure was used as for Printing Plate Precursor 4 except that Coating Solution 5 was used.

Printing Plate Precursor 6:

The same coating procedure was used as for Printing Plate Precursor 4 except that Coating Solution 6 was used.

Printing Plate Precursor 7:

The same coating procedure was used as for Printing Plate Precursor 1 except that Coating Solution 7 was used.

Invention Example 1

Samples of Printing Plate Precursor 1 were imaged using a Kodak® Trendsetter 800 II Quantum platesetter. Internal test patterns ‘plot 0’ and ‘plot 5’ were applied using exposure energies of 100, 112, 128, 150, 179 and 224 mJ/cm$^2$ at 13 watts head power. The imaged elements were developed using a mixture of SWD1, 1 part and water, 2 parts. Development was performed by immersing the plate in developer for 40 seconds, swabbing lightly for 20 seconds and then rinsing with water. The printing plates were evaluated for the exposure energy required to give a clean image and the exposure energy required to give best image reproduction. A good image was produced with good contrast. The cleanout and optimal exposure energies were 150 and 179 mJ/cm$^2$ respectively.

Invention Example 2

The same procedure was performed as for Invention Example 1 except that a mixture of ND1, 1 part, and water, 7 parts, was used to develop the imaged Printing Plate Precursor 1. A good image was produced with good contrast. The cleanout and optimal exposure energies were 179 and 224 mJ/cm$^2$ respectively.

Invention Example 3

The same procedure was performed as for Invention Example 1 except that a mixture of SWD1, 1 part, and water, 1 part, was used to develop imaged Printing Plate Precursor 2. A good image was produced with good contrast. The cleanout and optimal exposure energies were 179 and 224 mJ/cm$^2$ respectively.

Invention Example 4

The same procedure was performed as for Invention Example 1 except that a mixture of ND1, 1 part, and water, 5 parts, was used to develop imaged Printing Plate Precursor 2. A good image was produced with good contrast. The cleanout and optimal exposure energies were 150 and 179 mJ/cm$^2$ respectively.

Invention Example 5

The same procedure was performed as for Invention Example 1 except that a mixture of SWD1, 1 part, and water, 1 part, was used to develop imaged Printing Plate Precursor 3. A good image was produced with good contrast. The cleanout and optimal exposure energies were 179 and 224 mJ/cm$^2$ respectively.

Invention Example 6

The same procedure was performed as for Invention Example 1 except that a mixture of ND1, 1 part, and water, 6 parts, was used to develop imaged Printing Plate Precursor 3. A good image was produced with good contrast. The cleanout and optimal exposure energies were 179 and 224 mJ/cm$^2$ respectively.

Invention Example 7

The same procedure was performed as for Invention Example 1 except that a mixture of SWD1, 2 parts, and water, 1 part, was used to develop imaged Printing Plate Precursor 4. A good image was produced with good contrast. The cleanout and optimal exposure energies were 128 and 150 mJ/cm$^2$ respectively.

Invention Example 8

Samples of Printing Plate Precursor 5 were imaged using a Kodak® Trendsetter 800 II Quantum plate setter. Internal test patterns ‘plot 0’ and ‘plot 5’ were applied using exposure energies of 150, 171, 199, 239 and 299 mJ/cm$^2$ at 13 watts head power. The imaged elements were developed using a mixture of SWD1, 3 parts and water, 2 parts. Development was performed by immersing the element in developer for 40 seconds, swabbing lightly for 20 seconds and then rinsing with water. The printing plates were evaluated for the exposure energy required to give a clean image and the exposure energy required to give best image reproduction. A good image was produced with good contrast. The cleanout and optimal exposure energies were 239 and 299 mJ/cm$^2$ respectively.

Invention Example 9

Samples of Printing Plate Precursor 6 were imaged using a Kodak® Trendsetter 800 II Quantum plate setter. Internal test patterns ‘plot 0’ and ‘plot 5’ were applied using exposure energies of 100, 112, 128, 150, 179 and 224 mJ/cm$^2$ at 13 watts head power. The imaged elements were developed using a mixture of SWD3, 1 part, and water, 1 part. The development conditions were designed to simulate one-bath simple processing conditions. Development was performed by immersing the plate in SWD3 developer for 40 seconds and swabbing lightly for 20 seconds. Any excess SWD3 was removed using a squeegee and the printing plate was air dried. After 24 hours the printing plate was rinsed and evaluated for the exposure energy required to give a clean image and the exposure energy required to give best image reproduction. A good image was produced with good contrast. The cleanout and optimal exposure energies were 128 and 150 mJ/$cm^2$ respectively.

Invention Example 10

Samples of Printing Plate Precursor 7 were laser-exposed on a Kodak® Trendsetter 800II Quantum plate setter with an energy of 150 mJ/$cm^2$. The imaged elements were processed in a PK910 processor (supplied by Kodak Graphic Communications Japan LTD.) containing SWD1, 1 part, and water, 3.5 parts. The developer temperature was set to 30° C. and the conveyor speed was set to allow a 40 second immersion time in the developer solution. After processing, 850s finisher was applied to the plate surface and dried. The printing plates were then mounted on an A.B. Dick 9870 Duplicator Press (A.B. Dick, Niles, Ill., USA). The press was charged with Van Son Rubber Base black Ink (Van Son Ink, Mineola, N.Y., USA). An aqueous fountain solution contained about 23.5 ml/L (3 oz per gallon) Varn Litho Etch 142W (Varn International, Addison, Ill., USA), and about 23.5 ml/L (3 oz per gallon) Varn PAR (alcohol substitute) in water. The developing procedure was to wet a non-abrasive cloth with fountain solution and apply it to the plate with gentle rubbing. The press was started and the damping system engaged to further wet the plate with fountain solution. After a few revolutions, the inking system was engaged. 200 good copies were printed.

The invention has been described in detail with particular reference to certain preferred embodiments thereof, but it will be understood that variations and modifications can be effected within the spirit and scope of the invention.

The invention claimed is:

1. A method of providing an image comprising:

A) using a laser, imagewise exposing an imageable element to provide an exposed element having exposed and non-exposed regions, and B) contacting said exposed element with an alkaline processing solution having a pH of 12 or less to remove predominantly only said exposed regions, wherein the imageable element is an infrared radiation-sensitive positive-working imageable element comprising a substrate having thereon a single imageable layer, said imageable layer comprising an infrared radiation absorbing compound and a first polymeric binder comprising urethane or urea moieties in its backbone, wherein said first polymeric binder is insoluble in water and soluble in an alkaline solution, wherein said first polymeric binder is present in said imageable layer in an amount of at least 50 weight % based on said layer solids, and the alkaline processing solution is a single phase solution and has from about 0.5 to about 15 weight % of an organic solvent and is free of silicates and metasilicates, wherein the organic solvent is selected from the group consisting of (a) reaction products of phenol with ethylene oxide or with propylene oxide, (b) benzyl alcohol, (c) esters of ethylene glycol or of propylene glycol with an acid having 6 or less carbon atoms, (d) ethers of ethylene glycol, diethylene glycol, or of propylene glycol with alkyl groups having 6 or less carbon atoms, (e) and mixtures thereof.

2. The method of claim 1, wherein said alkaline processing solution has a pH of 11 or less.

3. The method of claim 1, wherein said alkaline processing solution both develops and provides a protective coating over the imaged and developed surface.

4. The method of claim 1, wherein said alkaline processing solution has a pH of 10.5 or less.

5. The method of claim 1, wherein the organic solvent is selected from the group consisting of ethylene glycol phenyl ether, benzyl alcohol, and 2-butoxyethanol, and mixtures thereof.

6. The method of claim 1, wherein the alkaline processing solutions has a pH of 10.2 or less.

7. The method of claim 1, wherein the processing solution further comprises one or more anionic surfactants, or one or more nonionic surfactants, or both one or more anionic surfactants and one or more nonionic surfactants.

8. The method of claim 1, wherein the first polymeric binder further comprises a sulfone unit in its backbone.

9. The method of claim 1, wherein the imageable layer further comprises a second polymeric binder that is insoluble in water and soluble in an alkaline solution having a pH of 12 or less in an amount of from about 2 weight % and up to and including 50 weight %, based on the imageable layer total weight.

* * * * *